US012692150B2

(12) United States Patent
Winden et al.

(10) Patent No.: US 12,692,150 B2
(45) Date of Patent: Jul. 28, 2026

(54) MICROELECTROMECHANICAL LOUDSPEAKER WITH A LARGE-AREA FORCE FIELD

(71) Applicant: Robert Bosch GmbH, Stuttgart (DE)

(72) Inventors: Andreas Winden, Reutlingen (DE); Bernhard Gehl, Wannweil (DE); Daniel Maier, Leonberg (DE); Peter Engelhart, St. Johann (DE)

(73) Assignee: ROBERT BOSCH GMBH, Stuttgart (DE)

( * ) Notice: Subject to any disclaimer, the term of this patent is extended or adjusted under 35 U.S.C. 154(b) by 163 days.

(21) Appl. No.: 18/815,919

(22) Filed: Aug. 27, 2024

(65) Prior Publication Data

US 2025/0083948 A1    Mar. 13, 2025

(30) Foreign Application Priority Data

Sep. 12, 2023    (DE) ..................... 10 2023 208 843.6

(51) Int. Cl.
        *B81B 3/00*        (2006.01)
        *H04R 19/00*        (2006.01)
        *H04R 19/02*        (2006.01)
(52) U.S. Cl.
        CPC ........... *B81B 3/004* (2013.01); *H04R 19/005* (2013.01); *H04R 19/02* (2013.01);
                (Continued)
(58) Field of Classification Search
        CPC ...... H04R 2201/003; H04R 9/06; H04R 9/02; H04R 2400/11; H04R 19/005; H04R 19/02; B81B 3/004; B81B 2201/0257; B81B 2203/0127; B81B 2203/0163; B81B 2203/0315; B81B 2203/04
See application file for complete search history.

(56) References Cited

U.S. PATENT DOCUMENTS

| | | | |
|---|---|---|---|
| 2021/0297787 A1 | 9/2021 | Lo et al. | |
| 2023/0091340 A1 | 3/2023 | Melnikov et al. | |
| 2023/0212002 A1 | 7/2023 | Melnikov et al. | |

FOREIGN PATENT DOCUMENTS

| | | |
|---|---|---|
| DE | 102019203914 B3 | 7/2020 |
| DE | 102022128242 A1 | 4/2024 |

(Continued)

*Primary Examiner* — Tuan D Nguyen
(74) *Attorney, Agent, or Firm* — NORTON ROSE FULBRIGHT US LLP

(57)        ABSTRACT

A microelectromechanical loudspeaker. The loudspeaker includes a substrate, a housing arranged on the substrate, and a cavity delimited by the housing and the substrate. The loudspeaker includes a translation device, which is arranged in the cavity so as to be movable and deflectable in a specified movement direction parallel to the substrate surface and includes an arrangement of a plurality of movable fin structures, which are arranged next to one another in the movement direction and divide the cavity into a plurality of portions fluidically separated from one another, and a support structure connecting the movable fin structures to one another, and a drive device designed to deflect the translation device in the movement direction, including a plurality of drive units each including least one actuator electrode mechanically connected to the translation device and at least one stator electrode mechanically connected to the housing and/or the substrate.

16 Claims, 15 Drawing Sheets

(52) U.S. Cl.
CPC ................. *B81B 2201/0257* (2013.01); *B81B 2203/0127* (2013.01); *B81B 2203/0163* (2013.01); *B81B 2203/0315* (2013.01); *B81B 2203/04* (2013.01); *H04R 2201/003* (2013.01)

(56) References Cited

FOREIGN PATENT DOCUMENTS

| WO | 2021144400 | A1 | 7/2021 |
| WO | 2021223886 | A1 | 11/2021 |
| WO | 2022117197 | A1 | 6/2022 |

MICROELECTROMECHANICAL LOUDSPEAKER WITH A LARGE-AREA FORCE FIELD

FIELD

The present invention relates to a microelectromechanical loudspeaker with a large-area force field.

BACKGROUND INFORMATION

The fundamental goal or the challenge of MEMS-based loudspeakers is to achieve the highest possible SPL (sound pressure level). A high SPL is associated with a high displaced air volume. At the same time, the chip surface should be kept as small as possible for cost reasons, and therefore the SPL/chip surface characteristic variable needs to be optimized or increased.

Current MEMS loudspeakers are mostly designed as planar structures, wherein a vibratable membrane is excited in such a way that the displacement and/or compression of the fluid takes place vertically to the membrane plane. The excitation of such membranes typically takes place by means of a piezoelectric or electrostatic effect. Such an embodiment is described, for example, in U.S. Patent Application Publication No. US 2021/297787. Due to the limitation of the maximum deflection of the membrane, these systems have the disadvantage that the displacement of a large fluid volume is associated with a large surface area of the membrane and therefore with the surface of the MEMS element. A further limitation of the displaceable air volume is due to the membrane that is connected or clamped to the substrate material circumferentially. Due to this circumferential clamping, the deflection amplitude of the membrane varies across the surface of the membrane (in the clamped edge region, the deflection is virtually zero, while it is typically maximum in the center of the membrane). Such an uneven deflection of the membrane surface additionally reduces the displaced air volume and also increases the harmonic distortion (THD).

In U.S. Patent Application Publication No. US 2021/297787, structures of the membrane are proposed which reduce the uneven deflection to a certain extent, or increase the surface with maximum deflection, by providing, in the membrane center, a torsion-resistant "membrane plate," which is embedded circumferentially in the actual membrane acting as an actuator. In general, corresponding MEMS loudspeakers with such a planar structure or membrane have a fluidically effective surface, which is in principle smaller than the chip surface. That is, an increase in the air volume to be displaced is inevitably associated with an increase in the chip surface.

The related art therefore proposes concepts which do not comprise a single membrane with vibration in the vertical direction, but which comprise a plurality of laterally or horizontally movable elements, which extend in the vertical direction. The advantage here is that the displaced volume of the fluid does not only scale with the chip surface, but can also be influenced with the vertical dimension. Due to the vertical alignment and multiplication of the membranes, the fluidically effective surface area is multiplied and can be significantly larger than the actual chip surface. MEMS loudspeakers based on this basic concept are described, for example, in PCT Patent Application No. WO 2021/144400 and WO 2021/223886, and German Patent Application No. DE 10 2019 203 914, as well as in Kaiser et al. Microsystems & Nanoengineering (2019).

PCT Patent Application No. WO 2021/223886 describes a concept with which a separation of an active drive structure and a passive displacement structure is proposed, wherein the two structures are arranged one above the other (e.g., as a wafer stack). In other words: In the document, both structures (drive and displacement) are in the same region. These two structures can be mechanically connected to one another via a coupling element, so that a deflection in the active structure results in a movement of the passive displacement structure. Proposed drive structures are, for example, typical comb structures (comb-like interlocking electrode structures) which utilize the electrostatic attractive force.

PCT Patent Application No. WO 2022/117197 describes a microfluidic structural element with vertical displacement elements that is driven by stray electric fields. The displacement elements are clamped laterally on both sides. The stray electric fields are formed via electrodes which are arranged both on the bottom side of the cover substrate and on the top side of the base substrate. The electrodes are thus aligned toward the interjacent displacement structure and have the smallest possible distances to the displacement elements. The displacement elements are thus located on the end faces (top side and bottom side of the displacement elements) in the stray field of the electrodes (the stray field or the electric field between the electrodes has a directional component vertical to the surface of the electrodes and therefore parallel to the direction of extension of the displacement elements and a directional component along the deflection of the displacement elements. When the displacement elements are electrically controlled, the individual displacement element experiences an electrostatic force (acting on the top side and bottom side of the displacement structure), which causes a lateral deflection of the displacement element (due to the stray field component in the deflection direction of the displacement elements). In contrast to the concept from PCT Patent Application No. WO 2021/223886, the displacement elements do not form a passive displacement structure, but are actively controlled with an alternating voltage.

In addition to the high technological obstacle for industrial implementation, a disadvantage of this concept or drive concept of the displacer is in particular the low maximum deflection of the displacement elements; this deflection is in the range of a few micrometers (for principle-related reasons, this deflection can at most be only half the distance between the fixed electrodes). Due to this small deflection, a high SPL requires both many vertically arranged displacement elements with a small distance from one another (high periodicity) and high displacement elements in the vertical extension. Both necessities together lead to high requirements for the design (specification and tolerances) of the displacement elements, which casts technological feasibility into doubt.

The small deflection of the vertical displacement structures from PCT Patent Application No. WO 2022/117197 is in particular due to the fact that the surface of the electric force field in which a force can be exerted on the movable membrane or displacement structure is significantly limited. This also significantly limits the force for deflection. The limitation of the force field (and thus of the driving force) acting on the displacement structure is due to the fact that only the top sides and bottom sides of the vertically aligned (a few micrometers thin) displacement elements (end faces) are located in the force field (electric field). In other words, the very thin, a few micrometers wide end face of the vertically arranged displacement elements (membranes), which is located in the delimited force field of fixed, opposing electrodes, is "responsible" (so to speak) for the deflection or driving force of the entire membrane. The surfaces of the end faces are very small in comparison to the total extension of the membrane/displacement structure to be deflected and, as a result, so is the driving force. Or, in other words, the surface of the electric field in which the laterally deflectable membrane is located is small and thus also the possible driving force. A driving force that is too low results in a smaller deflection (and thus reduced output power of the loudspeaker) or else a more stringent specification with respect to the stiffness or mass of the displacement structure to be deflected. These increased requirements are inevitably associated with an increased risk with respect to industrial feasibility.

An object of the present invention is to provide an actuator structure for a MEMS-based loudspeaker concept with vertically aligned and laterally deflectable displacement structures, taking into account the technological producibility and a reduced process complexity, said actuator structure having high surface utilization for generating a large-area force field. This object may be achieved by certain features of the present invention. Advantageous example embodiments of the present invention are disclosed herein.

According to an example embodiment of the present invention, a microelectromechanical loudspeaker is provided, comprising a substrate with a substrate surface, a housing arranged on the substrate, a cavity delimited by the housing and the substrate, a translation device, which is arranged in the cavity so as to be movable and deflectable in a specified movement direction parallel to the substrate surface and comprises an arrangement of a plurality of movable fin structures, which are arranged next to one another in the movement direction and divide the cavity into a plurality of portions fluidically separated from one another, and a support structure connecting the movable fin structures to one another. Furthermore, the micromechanical loudspeaker comprises a drive device designed to deflect the translation device in the movement direction, comprising a plurality of drive units in each case comprising at least one actuator electrode mechanically connected to the translation device and at least one stator electrode mechanically connected to the housing and/or the substrate, wherein the actuator and stator electrodes assigned in each case to a drive unit are designed, when they are subjected to different electrical potentials, to generate an electrostatic force that accelerates the translation device in the movement direction. At least some of the movable drive electrodes are arranged on the support structure. Due to the accommodation of the drive electrodes on the support structure, a higher surface utilization for generating a large-area force field can be achieved and the driving force of the displacement structures can be increased. With the proposed design of the actuator structure, the active chip surface required for air displacement can thus be better utilized.

In one example embodiment of the present invention, it is provided that immovable fin structures arranged on the substrate or housing are in each case provided between two directly adjacent, movable fin structures. In this case, a gas volume that can be compressed by a movement of the movable fin structures in the movement direction is formed in each case between the movable fin structures and the immovable fin structures directly adjacent to them. This embodiment makes a particularly simple structure of the MEMS loudspeaker possible.

In a further example embodiment of the present invention, it is provided that two translation devices moving in opposite directions and comprising in each case a movable support structure and a plurality of movable fin structures arranged on the relevant support structure are provided in the cavity. The movable fin structures of the two translation devices are arranged alternately in the movement direction in such a way that a gas volume that can be compressed by a relative movement of the relevant fin structures is in each case formed between the movable fin structures of the first translation device and the movable fin structures of the second translation device. By means of this measure, a particularly large amount of gas can be displaced. This increases the efficiency of the MEMS loudspeaker.

In a further example embodiment of the present invention, it is provided that some of the actuator electrodes are arranged on the top side and/or on the bottom side of the at least one movable fin structure. This allows the surface available for the drive electrodes to be increased.

In a further example embodiment of the present invention, it is provided that the housing comprises a frame structure laterally enclosing the cavity, wherein the movable support structure is designed in the shape of a frame, in which the movable fin structures are laterally clamped. At least some of the actuator electrodes are arranged on the end faces of the support structure. Finally, the stator electrodes assigned to the relevant actuator electrodes are arranged on the inner sides of the frame structure that are arranged opposite the relevant end faces of the support structure. This allows the surface available for the drive electrodes to be increased.

In a further example embodiment of the present invention, it is provided that the housing comprises a frame structure laterally enclosing the cavity, wherein the movable support structure is designed in the shape of a frame, in which the movable fin structures are laterally clamped. Furthermore, at least some of the actuator electrodes are arranged on the outer side of the side walls of the support structure. The stator electrodes assigned to the relevant actuator electrodes are arranged on the inner sides of the frame structure that are arranged opposite the relevant side walls of the support structure. This also allows the surface available for the drive electrodes to be increased.

In a further example embodiment of the present invention, it is provided that the housing comprises a frame structure, which laterally encloses the cavity and in which the movable fin structures are laterally clamped. In a central region of the fin structures, the movable support structure interconnects the movable fin structures arranged next to one another in the movement direction. By means of this embodiment, the gas volume of the cavity can be increased.

In a further example embodiment of the present invention, it is provided that at least some of the movable fin structures on the top and/or bottom sides comprise lateral expansion structures, which extend in the movement direction and in each case comprise a plurality of actuator electrodes arranged next to one another in the movement direction. By means of such lateral expansions and the associated increase in the surface available for the arrangement of the actuator electrodes, the number of drive units can be increased. This results in a greater driving force.

In a further example embodiment of the present invention, it is provided that the actuator electrodes and the stator electrodes assigned to them in each case comprise a plurality of rail-shaped structures extending in the movement direction, wherein the rail-shaped structures of the actuator electrodes and the rail-shaped structures of the stator electrodes interlock like a comb. This allows the effective electrode surface of the drive electrodes to be significantly increased. Overall, this results in a greater driving force.

In a further example embodiment of the present invention, it is provided that the actuator electrodes and the stator electrodes are in each case planar and are arranged opposite one another and separated from one another by a defined gap. By means of this flat design of the drive electrodes and their non-overlapping arrangement, relatively large stroke movements of the translation device can be realized.

In a further example embodiment of the present invention, it is provided that the actuator electrodes and the stator electrodes are in each case arranged next to one another in the movement direction and form two interlocking, crenellated structures. With the crenellated, interlocking electrode structures, the electric field that can be used for the movable electrodes is significantly increased. The increase in the surface of the electric field results in a significant increase in the driving force.

In a further example embodiment of the present invention, it is provided that the actuator electrodes and the stator electrodes assigned to them are in each case designed in the form of a plurality of electrode plates, which are arranged one below the other in a direction perpendicular to the substrate surface and extend in parallel with the substrate surface. The electrode plates of the actuator electrodes and the electrode plates of the stator electrodes are arranged alternately in the direction perpendicular to the substrate plane and are in each case connected to one another via their own connection structure. With this meandering electrode arrangement, a particularly high increase in the surface of the force field is achieved, which is associated with a significant increase in the driving force.

In a further example embodiment of the present invention, it is provided that at least some of the actuator electrodes in each case comprise a two-dimensional arrangement of stamp electrodes extending in the movement direction and connected to one another via a connection structure. The stator electrodes assigned to the relevant actuator electrodes in each case comprise an arrangement of correspondingly shaped hole electrodes, wherein each hole electrode is designed to receive the stamp electrode assigned to it. Due to the further segmentation of the electrode structure perpendicular to the substrate surface, a further significant increase in the surface of the force field is achieved. This results in a further increase in the driving force.

In a further example embodiment of the present invention, it is provided that the stamp electrodes in each case have a cross-sectional profile with expansions extending perpendicularly to the movement direction. The hole electrodes assigned to these stamp electrodes have a cross-sectional profile adapted to the cross-sectional profile of the stamp electrodes. By means of such expansions, the effective electrode surface can be significantly increased. This is associated with a significant increase in the force field and thus also in the resulting driving force.

In a further example embodiment of the present invention, it is provided that the cross-sectional profile of the stamp electrodes is designed in the shape of a double-T-beam or cross. These two cross-sectional profiles are associated with a significant increase in the electrode surface and thus allow a significant increase in the force field and the driving force achievable thereby. At the same time, these cross-sectional profiles can be realized particularly simply by means of the processes used to produce microelectromechanical structures.

Finally, in a further example embodiment of the present invention, it is provided that the support structure comprises a displacement support, which connects the movable fin structures of the translation device to one another, and a drive support, which is mechanically connected to the displacement support and connects the actuator electrodes of the translation device to one another. Due to the spatial separation of the displacement structures and the drive structures, particularly efficient drive devices can be realized.

The present invention is explained in more detail below with reference to figures.

BRIEF DESCRIPTION OF THE DRAWINGS

FIG. 2 schematically shows a plan view of the MEMS loudspeaker of FIG. 1.

FIG. 10 schematically shows a plan view of the MEMS loudspeaker of FIG. 9.

DETAILED DESCRIPTION OF EXAMPLE EMBODIMENTS

Figure 1:
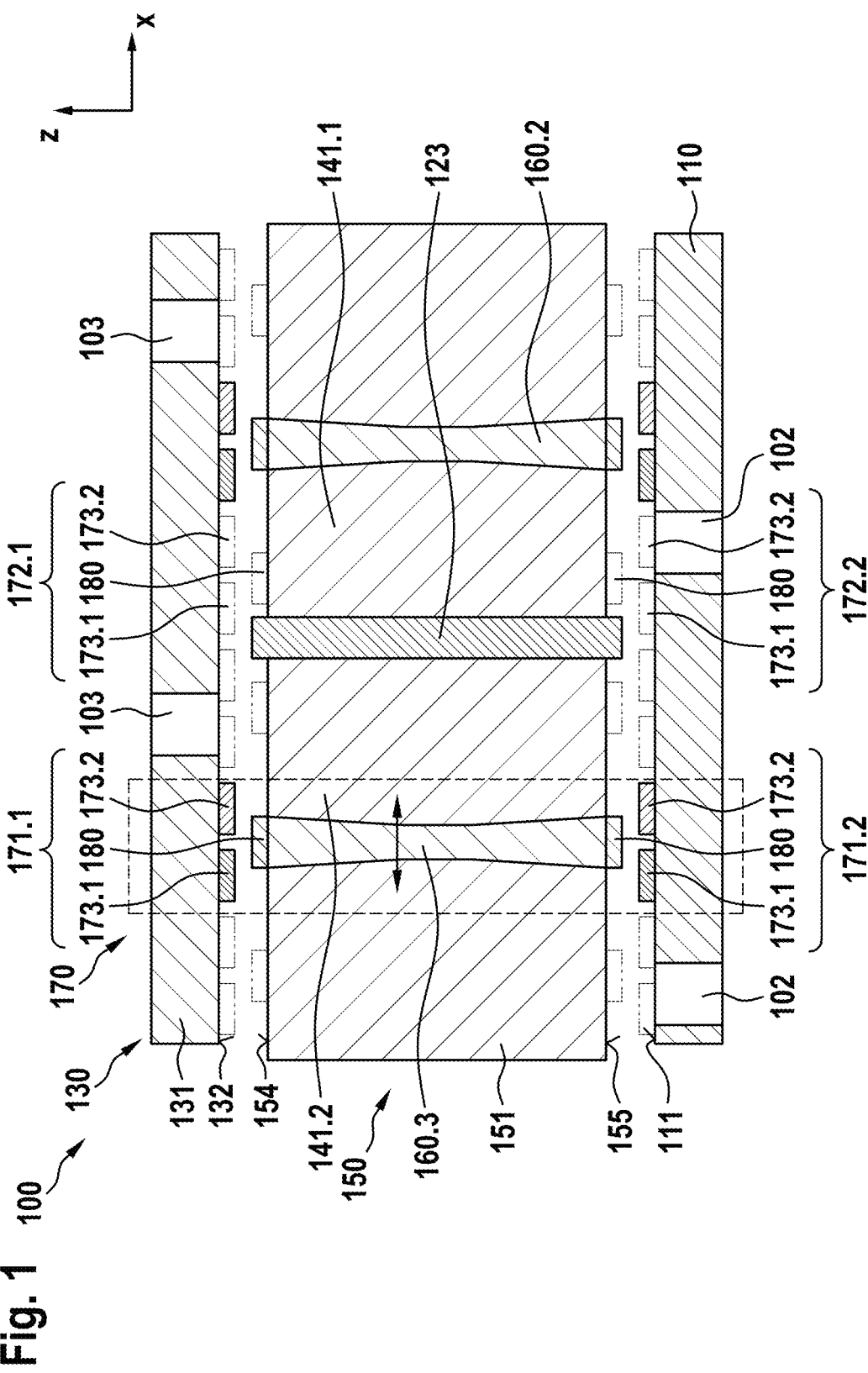
FIG. 1 schematically shows a cross-section through a MEMS loudspeaker with an expanded arrangement of the actuator electrodes and stator electrodes along the movement direction, according to an example embodiment of the present invention.

The present invention disclosed herein provides an actuator structure or translation device for a MEMS-based loudspeaker concept with vertically aligned and laterally deflectable displacement structures, the actuator structure or translation device having a high surface utilization for generating a large-area force field. The entire actuator structure, as a sum of all substructures, comprises a large-area electric field, i.e., the surface perpendicular to the electric field, which is aligned in parallel with the movement direction of the membrane or displacement structure and in which an assigned counter electrode experiences an electrostatic force. The translation device for generating the large-area force field, which does not necessarily have to be continuous, is not or only insignificantly associated with an increase in the chip surface. Rather, the proposed design of the actuator structure optimally utilizes the active chip surface required for air displacement.

Furthermore, the feasibility or simplicity of the production process in terms of process technology is ensured in that a largely planar design of the actuator structure is proposed in one exemplary embodiment. A concept that can be realized with a planar technology based on layer deposition is advantageous over a concept that necessarily requires deep structuring technology.

Due to the actuator concept proposed here, which includes an actuator arrangement or translation device and an actuator method, the total, added-up surface of the electric field is maximized. This refers to the component of the electric field with a field direction parallel to the movement direction, since only this component of the electric field can be used for an electrostatic force in the movement direction. In this respect, the term "surface" is understood to mean the surface that is perpendicular to these electric field lines. The surface of the force field is maximized by a multiple arrangement of drive structures, comprising fixed electrodes (stator electrodes) and movable electrodes (actuator electrodes).

Exemplary MEMS structures, in which the actuator concept according to the present invention with a large-area actuator arrangement for a large-area force field is realized in different ways, are described below. The MEMS loudspeaker concept described comprises vertically extended, deflectable and laterally movable fins, or fin structures, which serve as displacement elements for displacing air.

In the following exemplary embodiments, the immovable electrodes for generating a static electric field (stray electric field) are, by way of example, arranged fixedly on the cover wafer or base wafer, while the movable electrodes are mechanically connected to the movable fin structures and generate an alternating electric field that interacts with the static electric field. In principle, however, this arrangement can be designed the other way around, wherein the movable electrodes mechanically connected to the fin structures serve to generate a static electric field, while the immovable electrodes arranged fixedly on the cover wafer or base wafer generate the alternating electric field.

FIG. 1 shows a cross-section of a MEMS loudspeaker 100 with two laterally movable fin structures 160.2, 160.3 with a relative movement with respect to a fixed wall or fin structure.

The dashed frame illustrates the drive principle with two fixed drive electrodes (stator electrodes) 173.1, 173.2, each of which is subjected to a different electrical potential, for generating an electric field, in which the movable drive electrode (actuator electrode) 180, which is mechanically connected at the end face to the movable fin structure 160, experiences a laterally aligned force in or counter to the movement direction x. An alternating potential is applied to the movable actuator electrode 180, so that this electrode 180 experiences a directional, laterally aligned force in the static (stray) electric field of the fixed stator electrodes 173.1, 173.2. Each actuator electrode 180, together with the stator electrodes 173.1, 173.2 assigned to it, forms a separate drive unit 172.5, 172.6 in each case.

In addition to this electrode arrangement, a support structure 151 serving as a frame or shuttle is provided, which moves with the fin structures 160. In the present embodiment, the support structure 151 has the shape of a frame, in which the movable fin structures 160 are laterally clamped.

Additional movable electrodes 180 are arranged on the top and bottom sides 154, 155 of the support structure 151 and, with immovable electrodes 173.1, 173.2 arranged correspondingly opposite on the surface 111 of the substrate wafer 110 and on the bottom side 132 of the cover structure (cover wafer) 130, form additional drive units 172.1, 172.2. The additional drive units 172.1, 172.2 cause an increase in the surface of the force field.

Figure 2:
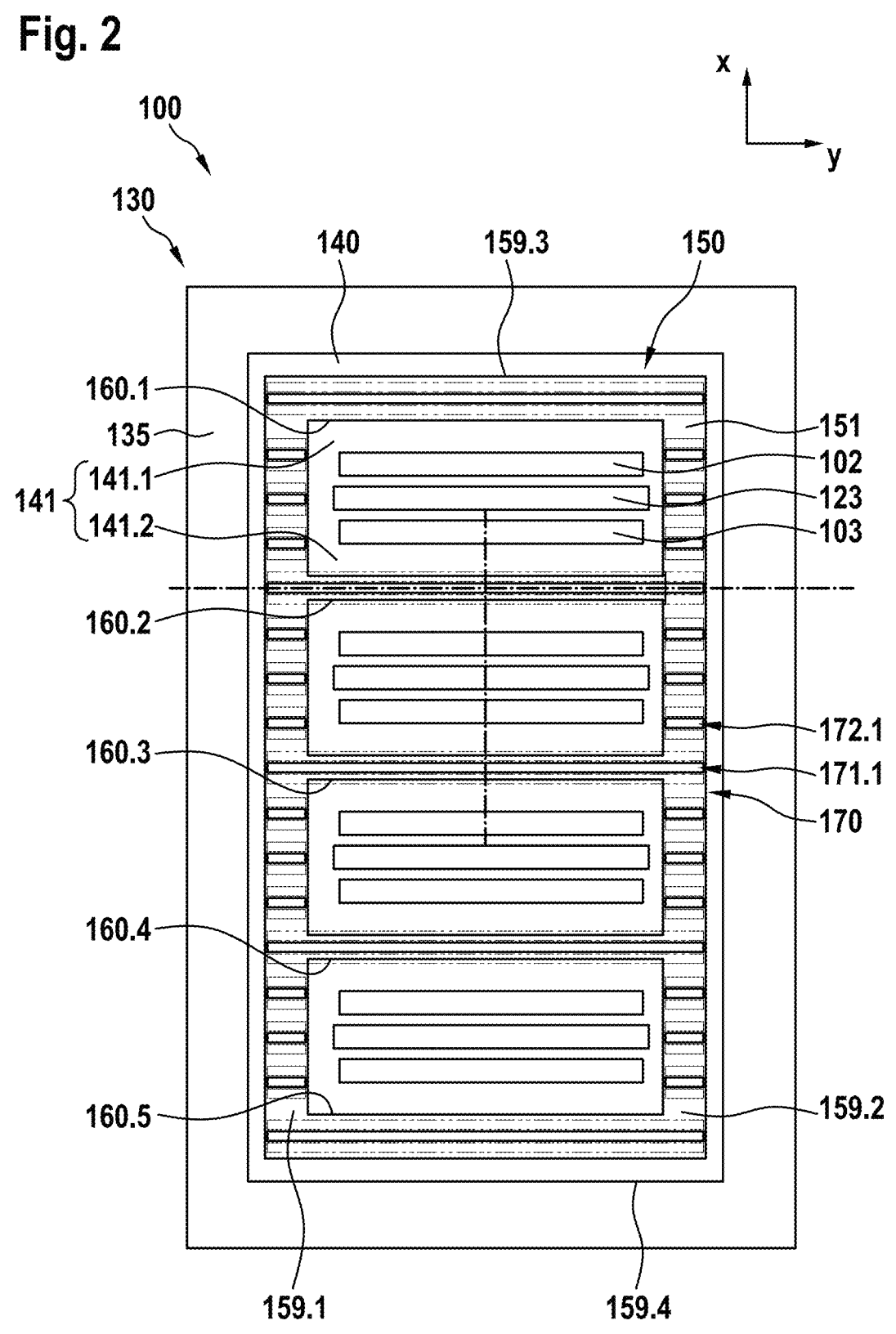

FIG. 2 shows a plane section of the MEMS loudspeaker of FIG. 1 parallel to the substrate surface 111 at the height of the stator electrodes 173.1, 173.2 arranged on the cover structure. Here, it can be seen that the frame-like shape of the support structure 151 comprises two longitudinal portions 159.1, 159.2 aligned in the movement direction x and two transverse portions 159.3, 159.4 extending transversely to the movement direction x. The support structure 151 is arranged in a cavity 140 laterally enclosed by a frame structure 135 forming the chip frame of the housing 130 and is fastened to the housing 130 and in particular to the frame structure 135 and/or to the substrate 110 via suitable elastic spring structures (not shown here) so as to be deflectable in the movement direction x. The fin structures $160_1$ up to $160_5$ are clamped between the two longitudinal portions 159.1, 159.2, wherein the outer fin structures $160_1$ and $160_5$ simultaneously form the transverse portions 159.3, 159.4 of the support structure 151. The fin structures 160.1 to 160.5 divide the cavity 140 into four separate partial cavities 141. In each of these partial cavities 141, a fixed wall 123 is arranged, which is designed in the form of a fin structure mechanically clamped between the substrate 111 and the cover structure 131 and by means of which the relevant partial cavity 141 is divided into two fluidically separated partial volumes 141.1, 141.2 in each case. Due to this arrangement, when the translation device 150 moves in the movement direction x, the gas volume arranged in a partial volume 141.1 reduced by this movement is compressed, while the gas volume contained in the relevant complementary partial volume 141.2 simultaneously expands, and vice versa. When the translation device 151 moves in the opposite direction, the previously compressed gas volumes expand, while the previously expanded gas volumes are compressed. When a gas volume is compressed, the corresponding gas escapes through a ventilation opening 102, 103 assigned to the corresponding partial volume 141.1, 141.2 within the substrate 111 or the cover structure 131. Conversely, when a gas volume expands, the gas flows through the corresponding ventilation opening 102, 103 into the corresponding partial volume 141.1, 141.2.

Figure 3:
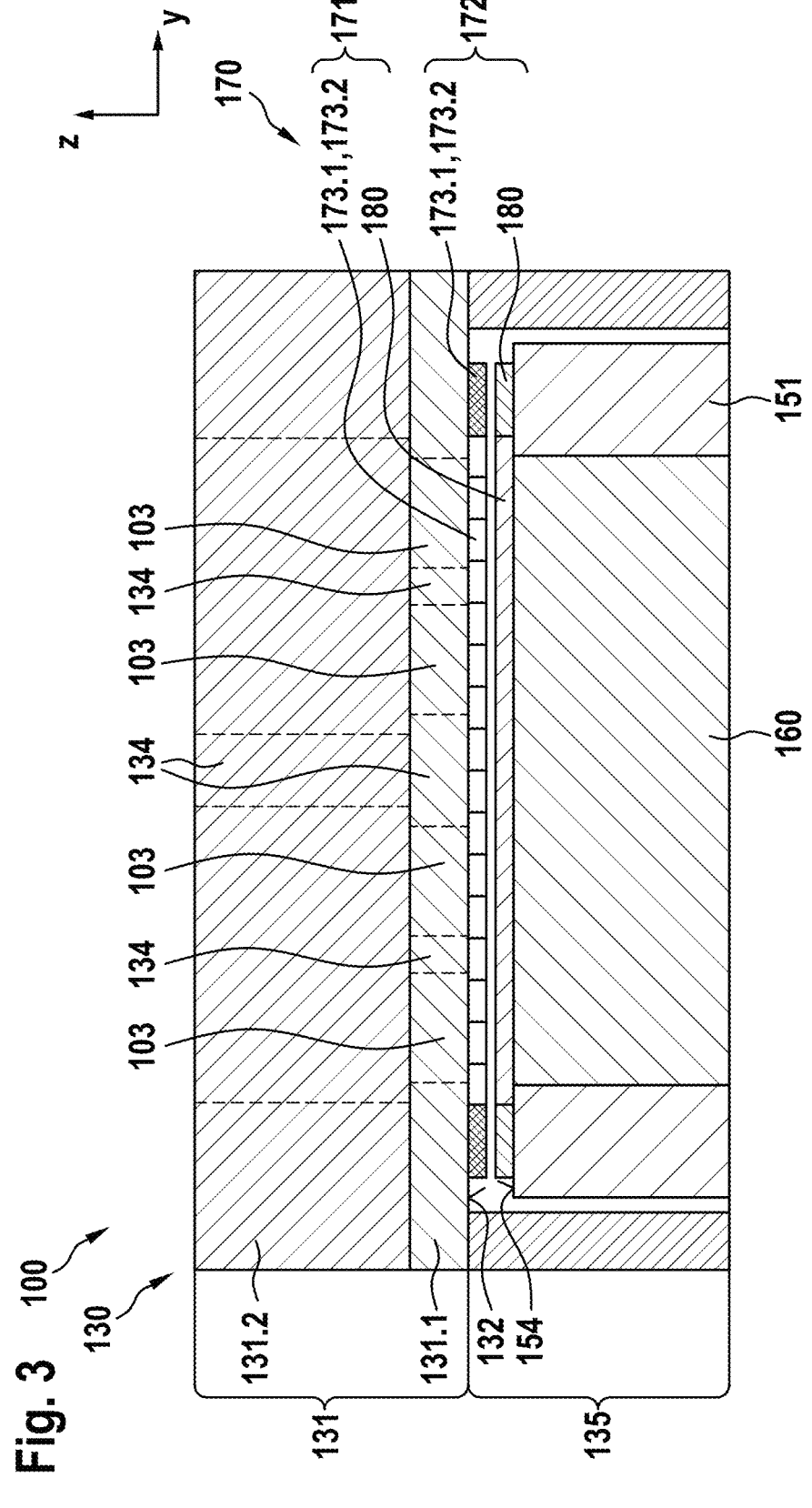
FIG. 3 schematically shows a cross-section through the MEMS loudspeaker of FIG. 1 in a plane perpendicular to the movement direction.

FIG. 3 shows a cross-section of the MEMS loudspeaker of FIGS. 1 and 2 in a second sectional plane, which runs along the ventilation opening 102 and is indicated in FIG. 2 by means of a second dot-dashed line. As indicated here, the gap between the actuator electrodes 180 arranged on the top side 154 of the support structure 151 and the fin structure 160 and the stator electrodes 173.1, 173.2 arranged on the bottom side 132 of the cover structure 131 preferably has the smallest possible width, in order to achieve the best possible fluidic separation of adjacent partial volumes. The small gap width also makes better electrostatic interaction between the complementary drive electrodes possible, which is associated with a higher force effect.

Furthermore, it can be seen in FIG. 3 that the cover structure 131 can comprise suitable reinforcement structures 134, which increase the stability of the MEMS structures, in the region of the ventilation openings 102.

Figure 4:
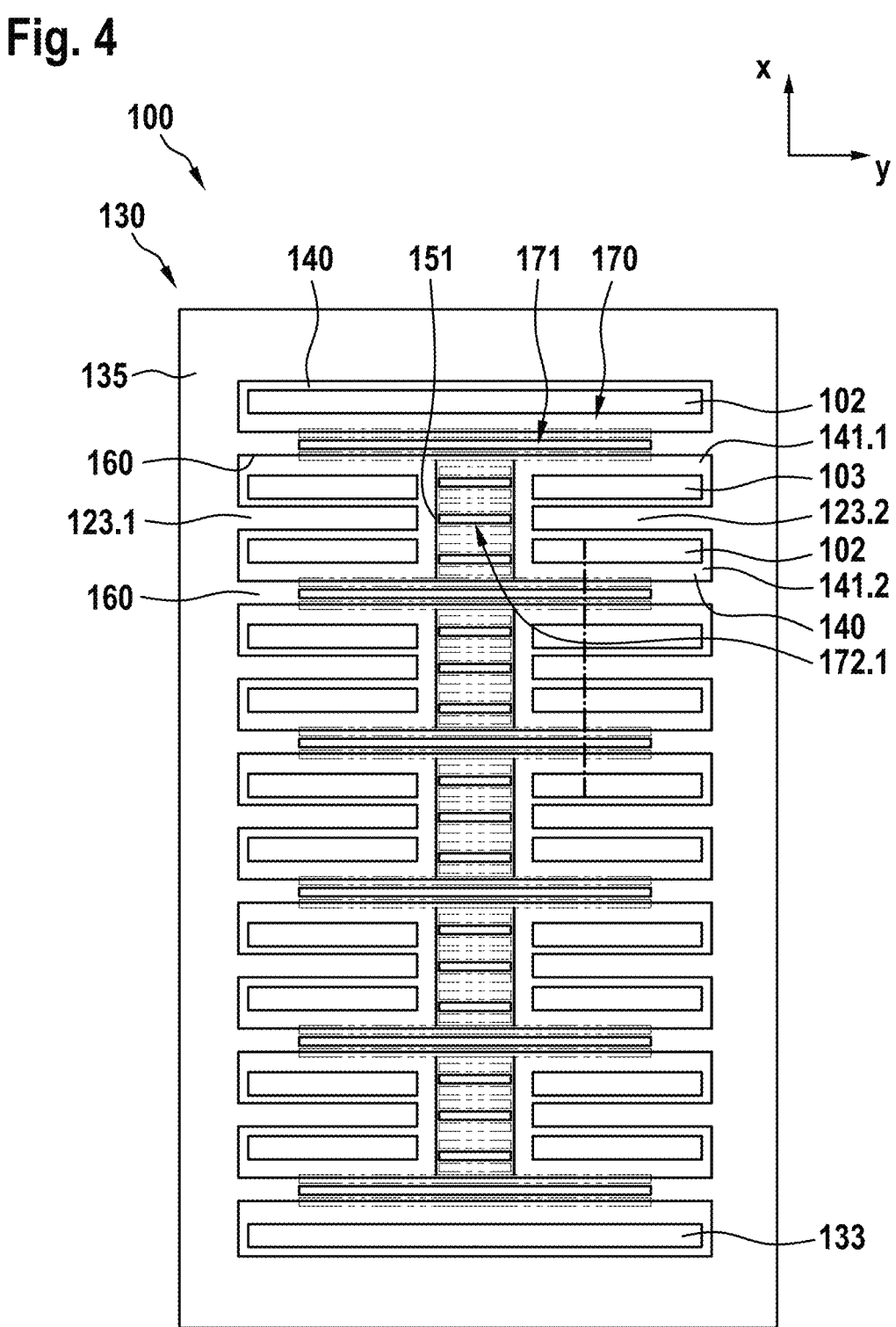
FIG. 4 schematically shows a plan view of a MEMS loudspeaker according to a further example embodiment of the present invention, in which one of the support structures connects the individual movable fin structures in their central region to one another, FIG. 5 schematically shows a cross-section through a MEMS loudspeaker according to a further embodiment with two movable fin structures driven in opposite directions, according to an example embodiment of the present invention.

As an alternative to the design of the MEMS loudspeaker 100 shown in FIG. 2, in which the movable fin structures 160 are clamped in a frame-shaped support structure 151, translation devices 150 with internal support structures 151 can also be realized. FIG. 4 shows a corresponding exemplary embodiment, wherein it can be seen that the support structure 151 arranged in a central region of the cavity 140 and connecting the fin structures 160 to one another is, in each case, mechanically connected to the relevant fin structures in a central portion of the movable fin structures 160. Furthermore, it can be seen that the individual fin structures 160 are clamped in the frame structure 135. In order to allow a relative movement of the fin structures relative to the rigid frame structure 135, the relevant fin structures 160 must have sufficiently high elasticity at least in the portions directly adjacent to the frame structure 135. Alternatively, it is however also possible to mechanically connect the movable fin structures 160 to the frame structure 135 via special elastic coupling elements (not shown here). In a further alternative embodiment, the fin structures can also be formed without a direct mechanical connection to the frame structure 135. In this case, the support structure 151 can be mechanically fastened to the housing 130 (in particular to the frame structure 135) and/or to the substrate 110 by means of suitable elastic coupling elements.

As can also be seen in FIG. 4, the immovable fin structures 123, in each case arranged between two directly adjacent, movable fin structures 160, are constructed in two parts in this embodiment, wherein each of the two portions 123.1, 123.2 separated from one another by the support structure 151 is in each case fastened on one side to the frame structure 135. In the event that the support structure

151 does not extend over the entire height of the movable fin structures, the immovable fin structures 123.1, 123.2 can also be connected to one another by a central portion not shown here. In this case, the immovable fin structures can comprise a suitable opening for the support structure 151 (not shown here).

The substantial difference between the embodiment variant shown in FIG. 4 and the concept shown in FIG. 2 is substantially the internal support structure or shuttle structure 151. The fin structures 160 are integrated on both sides not in a frame-shaped support structure 151, but directly in the frame structure 135 (chip frame). The internal support structure 151 does not have to be formed over the entire height (like the support structure in FIG. 2, for example). Rather, this support structure 135 can be designed only as a mechanical coupling structure which is mechanically connected at the end face to the fin structures 160 and thus mechanically couples the fin structures 160 to one another. Here as well, in addition to the force field in the end-face region of the fin structures 160, the surface for generating the force field is increased by also utilizing the surface of the support structure 151 for accommodating further drive units 172.1.

Figure 5:
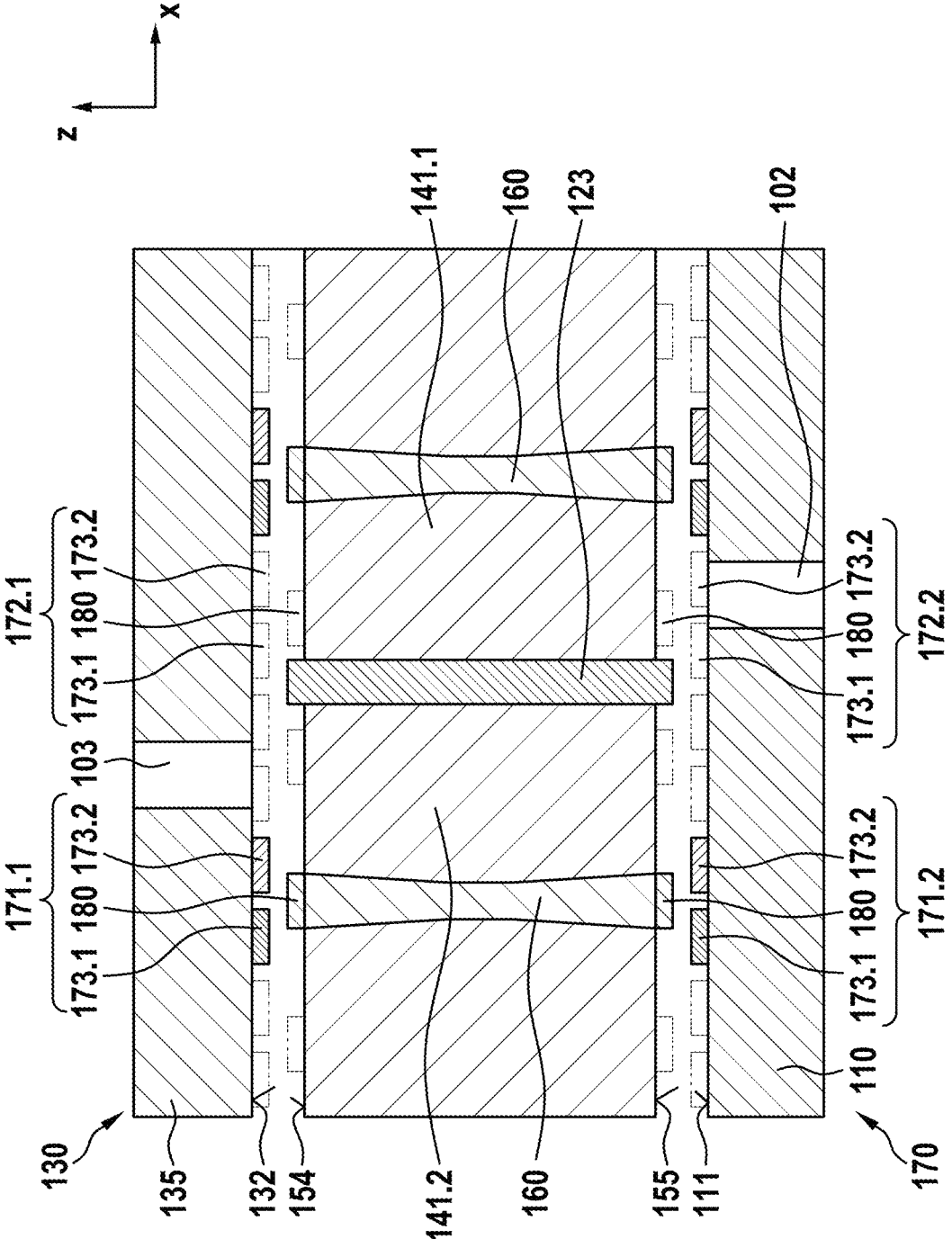

FIG. 5 shows a cross-section through the MEMS loudspeaker structure 100 of FIG. 4. It can be seen that the structure and thus also the function of a functional unit formed between two directly adjacent, movable fin structures 160 substantially correspond to the first embodiment shown in FIG. 2.

While a single gas volume is always compressed in the above-described exemplary embodiments by a movement of a movable fin structure relative to a fixed fin structure serving as a rigid wall, a corresponding gas volume in the embodiment shown in FIG. 5 is achieved by an opposite movement of two independently deflectable translation devices 151.1, 151.2. The two translation devices 150.1, 150.2 substantially correspond to the translation device 150.1 shown in FIG. 4 with internal support structures 151, although no fixed walls are introduced here, but rather two adjacent fin structures 160 move relative to one another.

Figure 6:
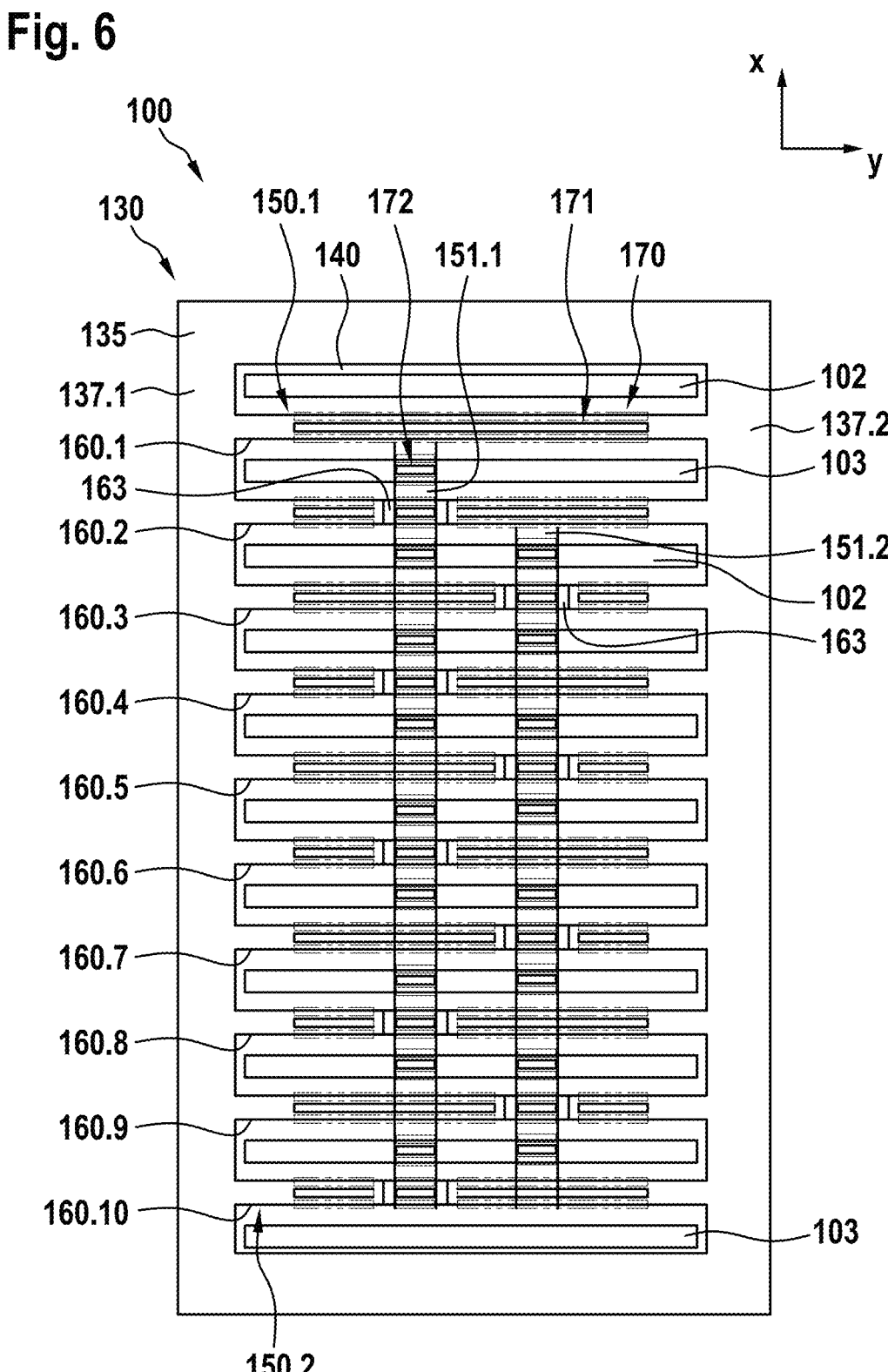
FIG. 6 schematically shows a plan view of the MEMS loudspeaker with two translation devices moving in opposite directions to one another, according to an example embodiment of the present invention.

As can be seen in FIG. 6, which shows a plane section of the MEMS loudspeaker 100 of FIG. 5 parallel to the substrate surface 111 at the height of the stator electrodes 173.1, 173.2 arranged on the cover structure, the movable fin structures 160.1, 160.3, 160.5, 160.7 and 160.9 are assigned to the first translation device 150.1 and are connected to one another by a first support structure 151.1, while the movable fin structures 160.2, 160.4, 160.6, 160.8 and 160.10 are assigned to the second translation device 150.2 and are connected to one another by a second support structure 151.2. Due to this arrangement results, an offset of the two translation devices 150.1, 150.2 is produced in the movement direction x. The two support structures 151.1, 151.2 are mechanically decoupled from one another in order to make movement of the two translation devices 150.1, 150.2 in opposite directions possible. For this purpose, the movable fin structures 160.2, 160.4, 160.6, 160.8 and 160.10 have suitable recesses or openings 163, through which the support structure 151.1 of the first translation device 150.1 protrudes. Analogously, the movable fin structures 160.3, 160.5, 160.7 and 160.9 have corresponding recesses or openings 163, through which the support structure 151.2 of the second translation device 150.2 protrudes.

In order to ensure sufficient movement of the two translation devices, the fin structures 160.1 to 160.10 can be designed to be elastic. This elasticity can in particular be particularly pronounced in the outer portions of the fin structures that are adjacent to the frame structure 135. Alternatively, it is however also possible to mechanically connect the movable fin structures 160 to the frame structure 135 via special elastic coupling elements (not shown here). In a further alternative embodiment, the fin structures 160 can also be formed without a direct mechanical connection to the frame structure 135. In this case, the support structure 151 can be mechanically fastened to the housing 130 (in particular to the frame structure 135) and/or to the substrate 110 by means of suitable elastic coupling elements (not shown here).

Figure 7:
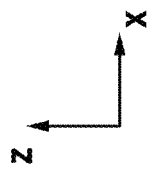
FIG. 7 schematically shows a cross-section through a MEMS loudspeaker according to a further example embodiment of the present invention, in which the movable fins comprise lateral expansion structures.

In order to further increase the driving force, it may be useful to increase the surface of the force field achieved by the drive electrodes. This can advantageously be achieved by increasing the number of drive electrodes. If there is no longer enough free space available for accommodating the electrodes on the translation device, the movable fin structures and/or the movable support structures can be equipped with lateral expansion structures. FIG. 7 shows a cross-section of an advanced design of the embodiment described in connection with FIG. 2. On their top and bottom sides, the movable fin structures 160.1 to 160.5 have additional planes, in which corresponding lateral expansion structures 164 are formed. Through a suitable structuring of the additional planes on the end faces of the fin structures 160.1 to 160.5, a type of canopy is in each case realized, on which the electrodes are arranged in a planar manner. With this measure, the surface of the force field can now be significantly increased. As can be seen in FIG. 7, the lateral expansions 164.1 on the top side of the fin structures 160.1 to 160.5 can extend in the movement direction x, while the lateral expansions 164.2 on the bottom side of the fin structures 160.1 to 160.5 extend in the opposite direction. In this way, the symmetry of the partial volume portions can be maintained.

Figure 8:
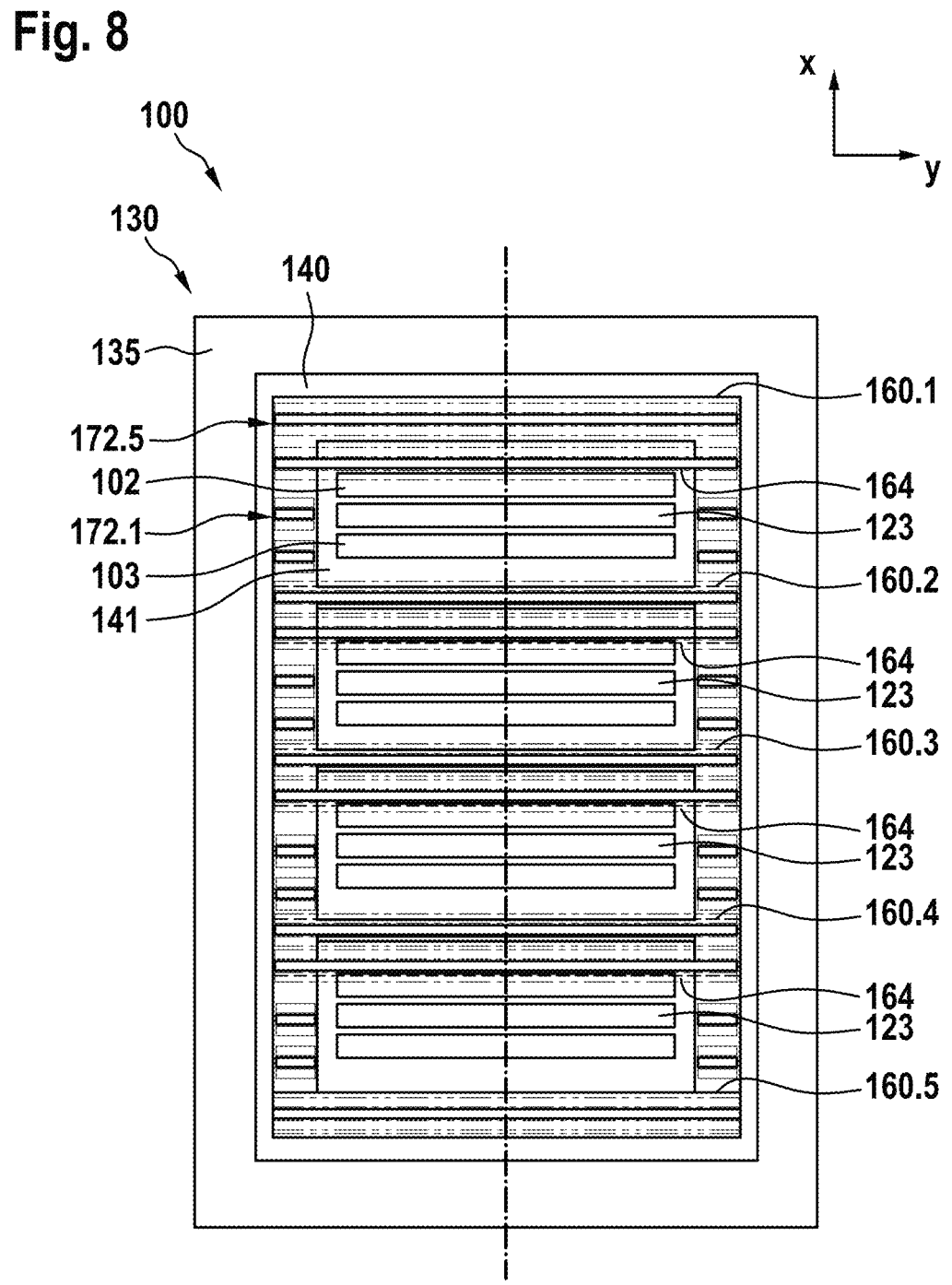
FIG. 8 schematically shows a plan view of the MEMS loudspeaker of FIG. 7.

FIG. 8 shows a plane section of the MEMS loudspeaker 100 of FIG. 7 parallel to the substrate surface 111 at the height of the stator electrodes 173.1, 173.2 arranged on the cover structure. The sectional plane of FIG. 7 is indicated by a dot-dashed line. Here, it can be seen that the lateral expansions 164, in particular in the regions above and below the partial volumes 141, result in a significant increase in the total electrode surface.

Figure 9:
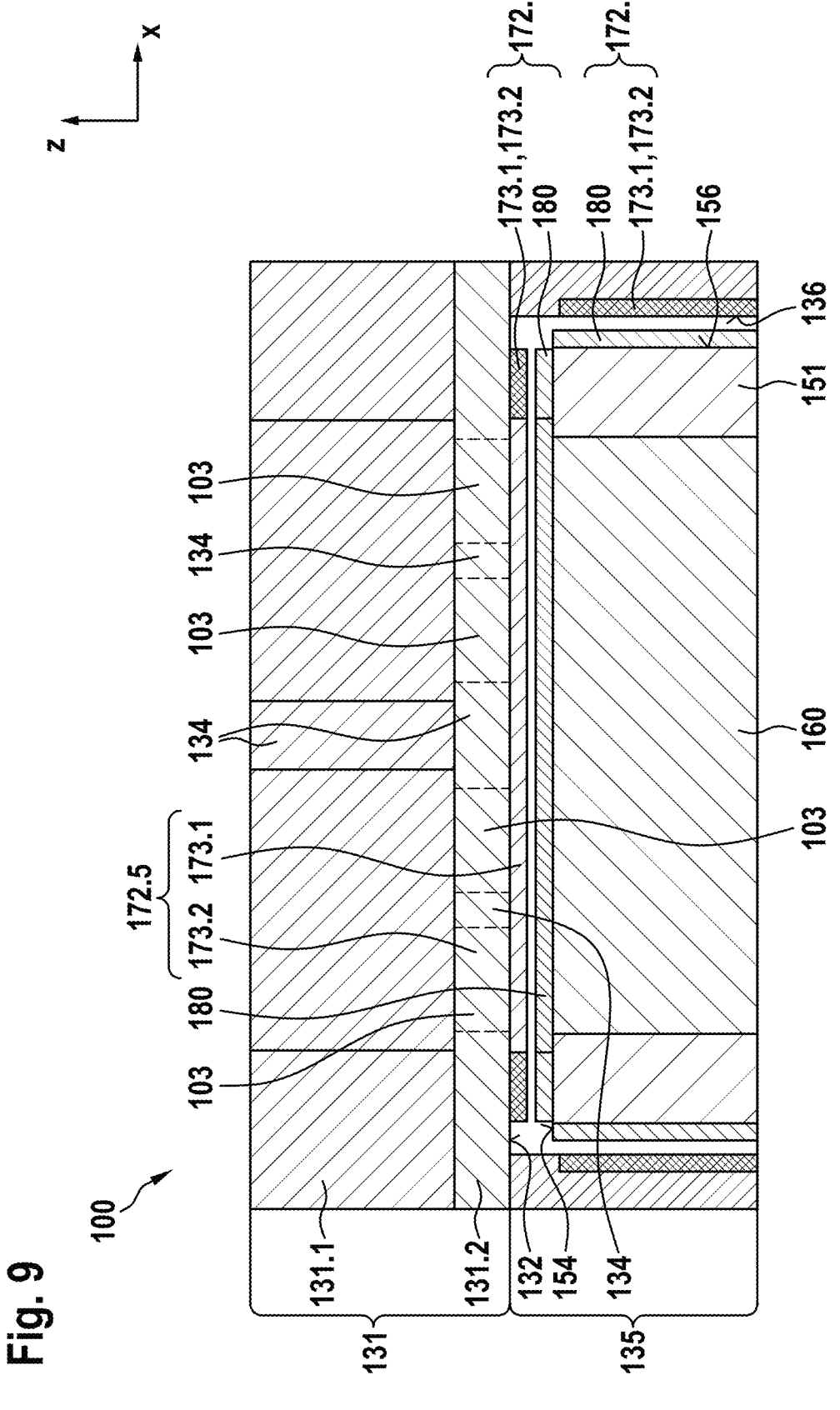
FIG. 9 schematically shows a cross-section through a MEMS loudspeaker according to a further example embodiment of the present invention, in which the side surfaces of the support structure are also used for accommodating the actuator electrodes.

FIG. 9 shows a further possible embodiment of the MEMS loudspeaker 100, in which the side surfaces of the frame structure 135 and the support structure 151 are utilized to increase the force field. As can be seen in this cross-sectional view of the MEMS loudspeaker 100, the side walls 156 of the support structure 151 along the movement direction x and the inner sides 136 of the frame structure 135 that are opposite them can be formed with alternating electrode arrangements 173.1, 173.2, 180, so that these surfaces 136, 156 also contribute to the increase in the surface of the force field.

Figure 10:
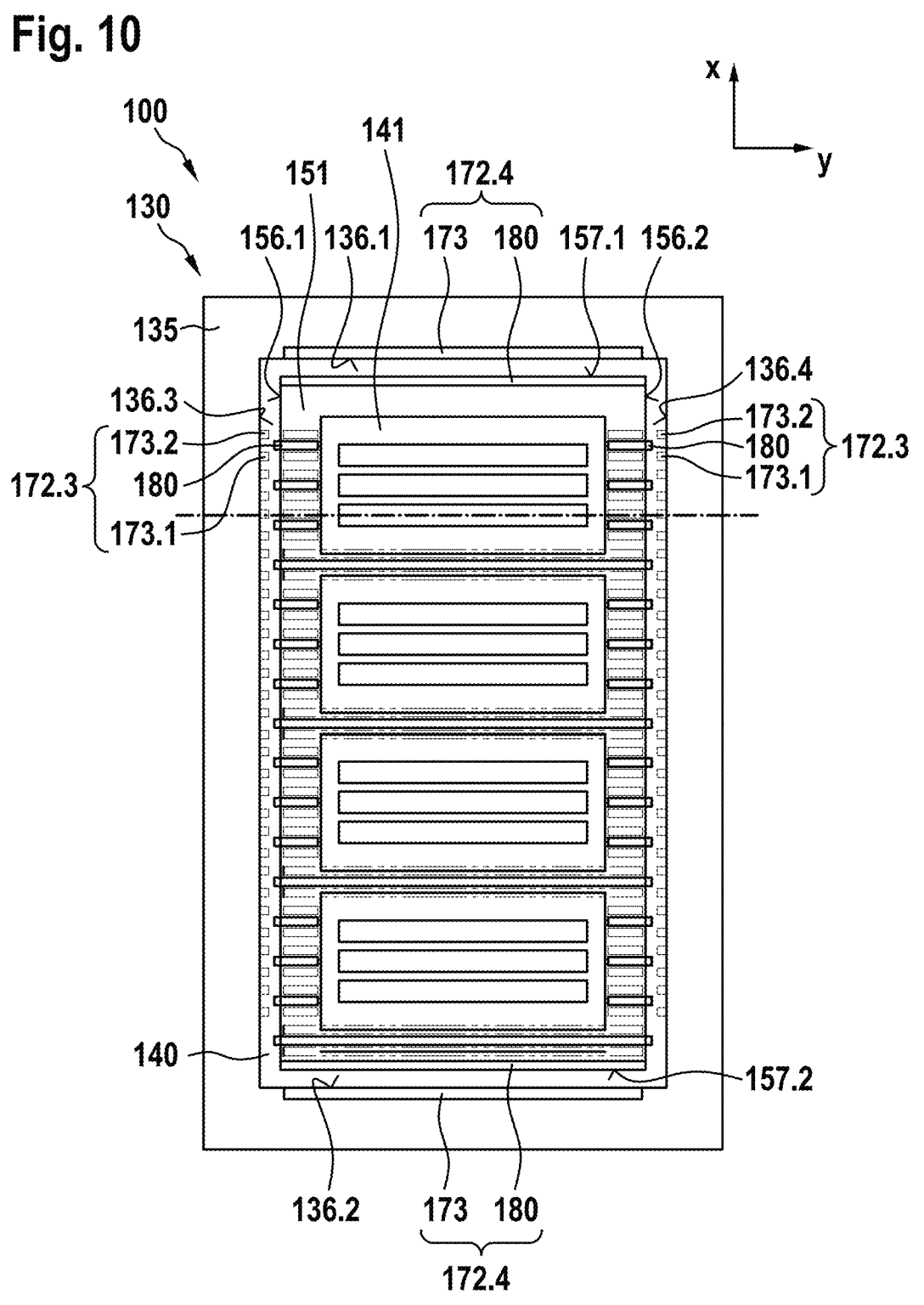

FIG. 10 shows a plane section of the MEMS loudspeaker 100 of FIG. 9 parallel to the substrate surface 111 at the height of the stator electrodes 173.1, 173.2 arranged on the cover structure 131. The dot-dashed line illustrates the sectional plane of FIG. 9. It can be seen that the actuator electrodes 180 arranged on the two side walls 156.1, 156.2 of the frame-shaped support structure 135 and the stator electrodes 173.1, 173.2 arranged opposite them on the two inner sides 136.3, 136.4 of the frame structure 135 in each case form corresponding drive units 172.3, which are preferably arranged along the entire length of the side walls 156.1, 156.2 of the frame-shaped support structure 151.

Additionally or alternatively, the end-face side surfaces 156.1, 156.2 of the support structure 151 with respect to the movement direction x can furthermore also be designed as electrodes of a parallel plate capacitor. By applying a corresponding potential to the electrodes, an attractive force can in each case be generated at one of the two end faces. FIG. 10 shows two corresponding drive units 172.4, in each case comprising an actuator electrode 180 arranged on an end face 157.1, 157.2 of the support structure 151 and a stator electrode 173 arranged on an inner side 136.1, 136.2 of the frame structure 135 that faces the relevant end face 157.1, 157.2.

Figure 11:
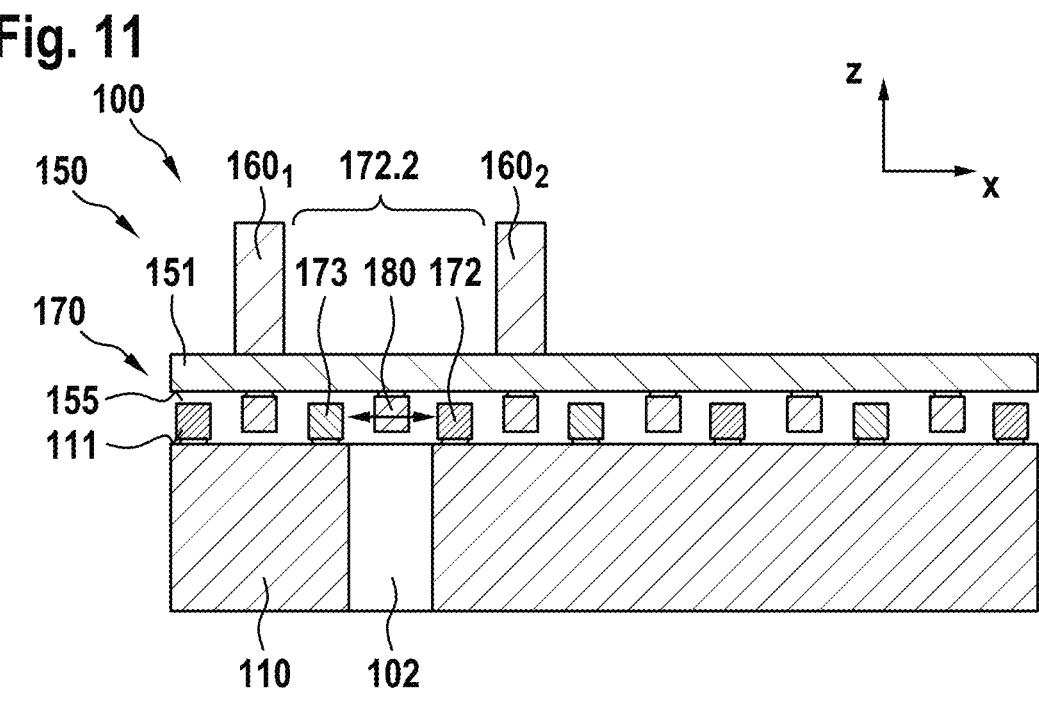
FIG. 11 schematically shows a cross-section through a MEMS loudspeaker according to a further example embodiment of the present invention, in which the drive electrodes interlock in a crenellated shape.

FIG. 11 shows an alternative design of the electrodes for a further increase in the surface of the electric field, with the drive electrodes interlocking in a crenellated shape. In the embodiments described above, the MEMS loudspeakers have planar electrode structures. Due to the planar design of the drive electrodes 180, 173 in the movement direction x, the (stray) electric field that can be used by the relevant counter electrode and is located between the relevant actuator electrode and stator electrode is very weak, since it depends, among other things, on the distance between the movable electrode and the fixed electrode. With the crenellated, interlocking electrode structure shown in FIG. 11, this electric field (field lines parallel to the movement direction in the region of the movable electrode) that can be used for the movable actuator electrode 180 is significantly increased. In principle, the crenellated design of the electrodes (fixed and movable) can be combined with all previously presented options.

Figure 12:
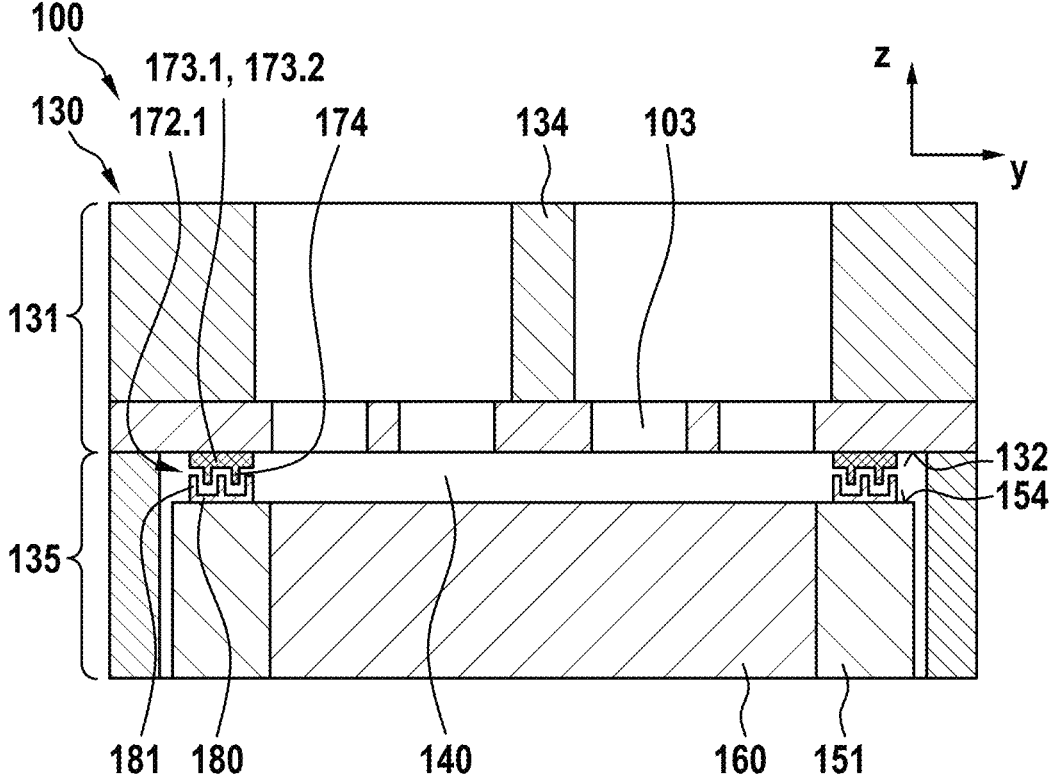
FIG. 12 schematically shows a cross-section through a MEMS loudspeaker according to a further example embodiment of the present invention, in which the drive electrodes comprise interlocking, rail-shaped structures.

In order to maximize the driving force of the MEMS loudspeaker, the surface of the force field realized between the complementary drive electrodes can be increased by a special design of these electrodes. FIG. 12, by way of example, shows a modified drive unit, in which the effective electrode surfaces are increased in that the complementary electrodes (fixed and movable) 173, 180 comprise rail-shaped structures 174, 181, which interlock like a comb. The movement direction x is in the image plane in this cross-sectional drawing, so that the electrode structure 172.1 formed by the actuator electrode 180 and stator electrode 173 can also be considered as a rail (or "railway").

The concept of the comb-like interlocking electrodes can in principle also be realized with electrode structures that are arranged in parallel with the substrate surface 111. The following figures show further exemplary MEMS structures within the meaning of the present invention. Here, the actuator concept according to the present invention is also to be realized with a large-area actuator arrangement for a force field that has a surface as large as possible. As already described in connection with FIGS. 1 to 11, a drive device or actuator device is to drive one or more displacement elements separated therefrom, with fin structures that extend in the vertical direction and are deflectable in the movement direction x and laterally movable. The concept described below focuses on the design of the drive. The fin structures serving as displacement elements can be supplemented in the following embodiments analogously to the above-described embodiments.

Figure 13:
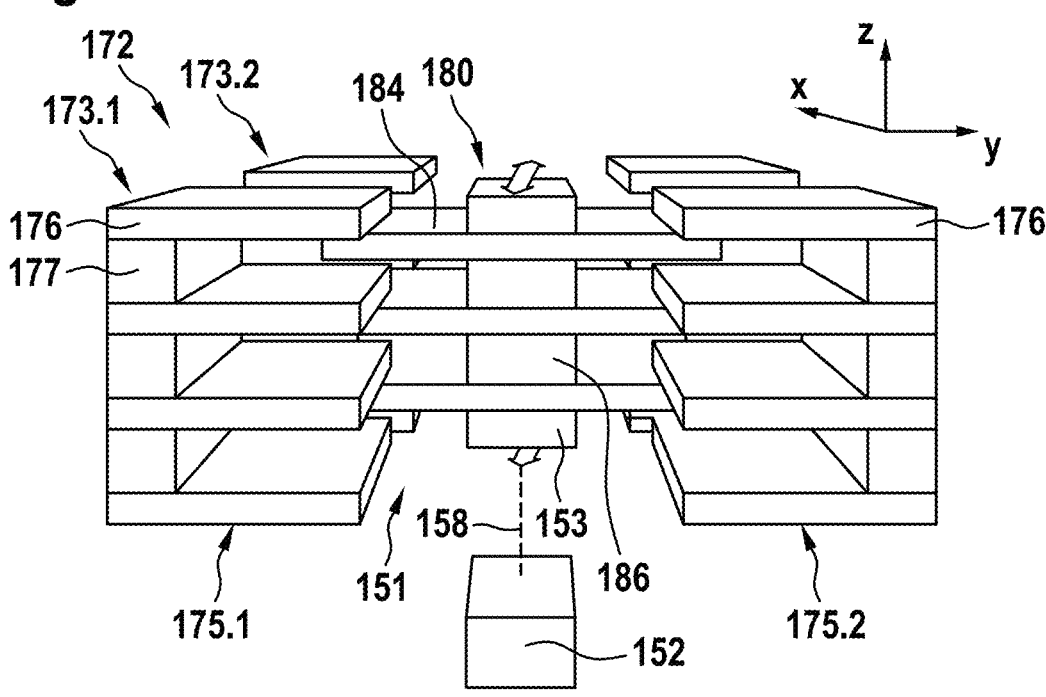
FIG. 13 schematically shows a perspective view of a drive unit of a further example embodiment of the MEMS loudspeaker of the present invention, in which the drive electrodes comprise electrode plates arranged one above the other in a stack, FIG. 14 schematically shows a plan view of an arrangement of two drive supports, driven in opposite directions, with plate-shaped actuator electrodes and the associated plate-shaped stator electrodes, according to an example embodiment of the present invention.

The arrangement shown in the FIG. 13 can, for example, be a more advantageous design of the drive devices 170 shown in FIG. 2 or 4. The basic principle is a multiplication (here vertical) perpendicular to the movement direction x of the electrode structures used in principle in FIG. 2 or 4, so that, in combination with a segmentation of the individual drive electrodes 173, 180 along the movement direction x, a multiplication of the sum of all forces generated by the drive in the movement direction x can be achieved. This advantage can be particularly well exploited if the drive device 170 is spatially separated from the actual displacement structures 160. The force transfer is realized via a displacement support 152 which serves as a shuttle for the movable displacement elements 160 and is mechanically connected, on the one side, to the drive support 153 likewise serving as a shuttle for the actuator electrodes 180 and, on the other side, to the individual movable fin structures 160 serving as displacement elements. The drive support 153 concentrates the tensile force of all drive units fastened thereto onto the displacement support 152 and causes a rectification over its entire lateral extension.

The drive principle corresponds to the drive unit 172.1 (marked with a dashed frame) described in connection with FIG. 1. Each drive unit 172 preferably comprises two fixed electrodes (stator electrodes) 173.1, 173.2 for generating an electric field and a movable electrode (actuator electrode) 180, which experiences a laterally aligned force in the electric field and transfers this force to the movable fin structures mechanically connected at the end face. In contrast to the embodiments already described, the fin structure 160 (displacement element) mechanically connected at the end face in FIG. 2 is replaced by a structure, which serves as a drive support 153 and moves bidirectionally between the two stator electrodes 173.1, 173.2.

The above-described arrangement is now improved in that the drive unit formed from the actuator electrode 180 and stator electrode 173 is multiplied vertically in this way. Perpendicularly to the movement direction x, this generates a meander structure, which is directly associated with an increase in the surface of the force field. The result is the 2D comb actuator shown in FIG. 13. The multiplication can be realized technologically via a layer stacking technique commonly used in semiconductor manufacturing, e.g., by means of a sequence of poly-Si deposition, trench, sacrificial oxide, oxide structuring, poly-Si, etc.

As can be seen in FIG. 13, each stator electrode 173.1, 173.2 comprises electrode plates 176, which are arranged one above the other in the vertical direction z and are mechanically and electrically connected to one another by means of connection structures 177 arranged therebetween in each case. The actuator electrode 180 also comprises electrode plates 184, which are correspondingly arranged one above the other and are mechanically and electrically connected to one another by means of connection structures 186 arranged therebetween in each case. The electrode plates 177, 184 are in each case arranged offset from one another in the vertical direction z, such that the electrode plates 184 of the actuator electrode 180 can move back and forth between the electrode plates 176 of the stator electrodes 173.1, 173.2 in the movement direction x.

As can also be seen in FIG. 13, the stator electrodes 173.1, 173.2 can in each case be suitably segmented in the center in such a way that a movement of the connection structures 186 of the actuator electrode 180 in the movement direction x between the two segments 175.1, 175.2 of the stator electrodes 173.1 173.2 can take place without hindrance.

As can also be seen in FIG. 13, the actuator electrode 180 is fastened together with further actuator electrodes to a common drive support 153, which is mechanically connected, for example by means of a suitable coupling structure 158 (here only indicated by the dashed line), to a displacement support 152 located above or below it.

Figure 14:
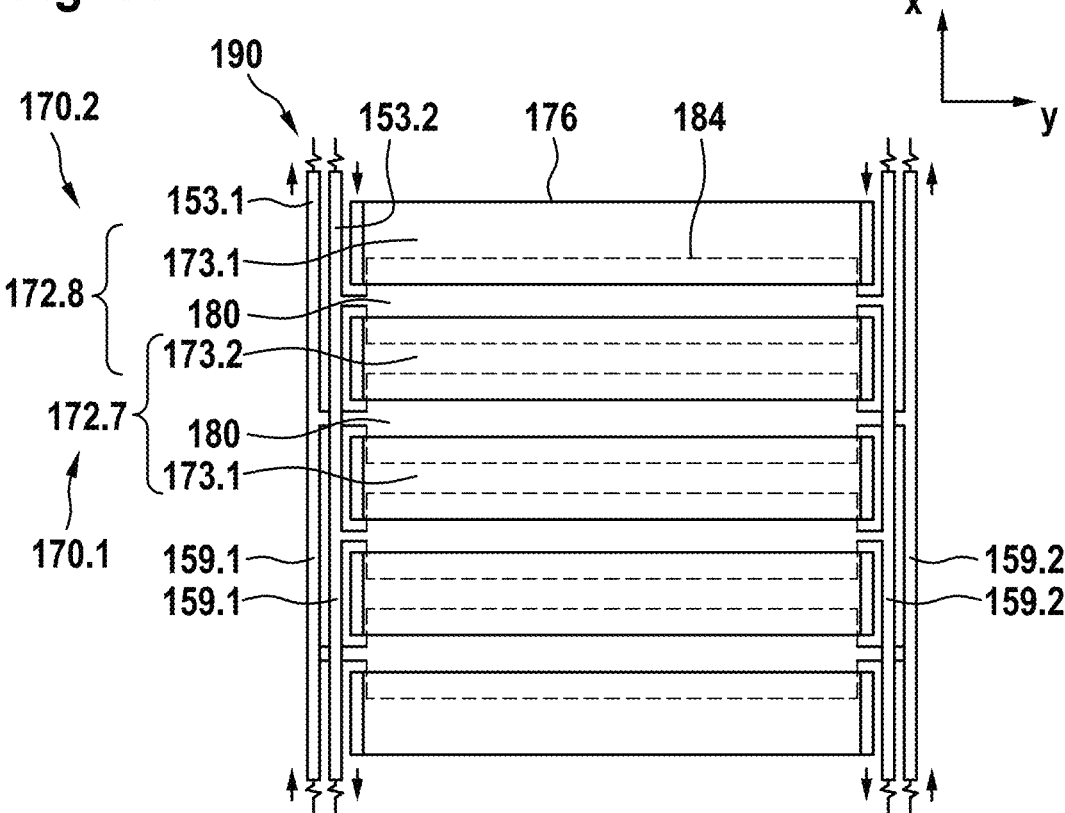

FIG. 14 shows a plan view of an embodiment with two drive supports 153.1, 153.2 moving in opposite directions to one another. Each of the drive supports 153.1, 153.2 is mechanically connected to a corresponding displacement support (not shown here) via a coupling structure 158 (also not shown here). The two drive supports 153.1, 153.2 can be suspended via suitable spring structures 190 in the chip frame, wherein the electrical potential can then also be applied to the actuator electrodes 180 via the spring structures 190. The two drive supports 152.1, 152.2 in each case comprise two portions 159.1, 159.2, which extend in the movement direction x and between which actuator electrodes 180 are in each case clamped. In the following exemplary embodiment, the actuator electrodes 180 have a vertical arrangement, which is analogous to the embodiments shown in FIG. 13 and comprises a plurality of electrode plates 184 electrically connected to one another. As indicated by the dashed lines, the electrode plates 184 of the actuator electrodes 180 in each case extend between the electrode plates 176 of the stator electrodes 173.1, 173.2, which are likewise designed in the form of a vertical arrangement of a plurality of electrode plates.

Figure 15:
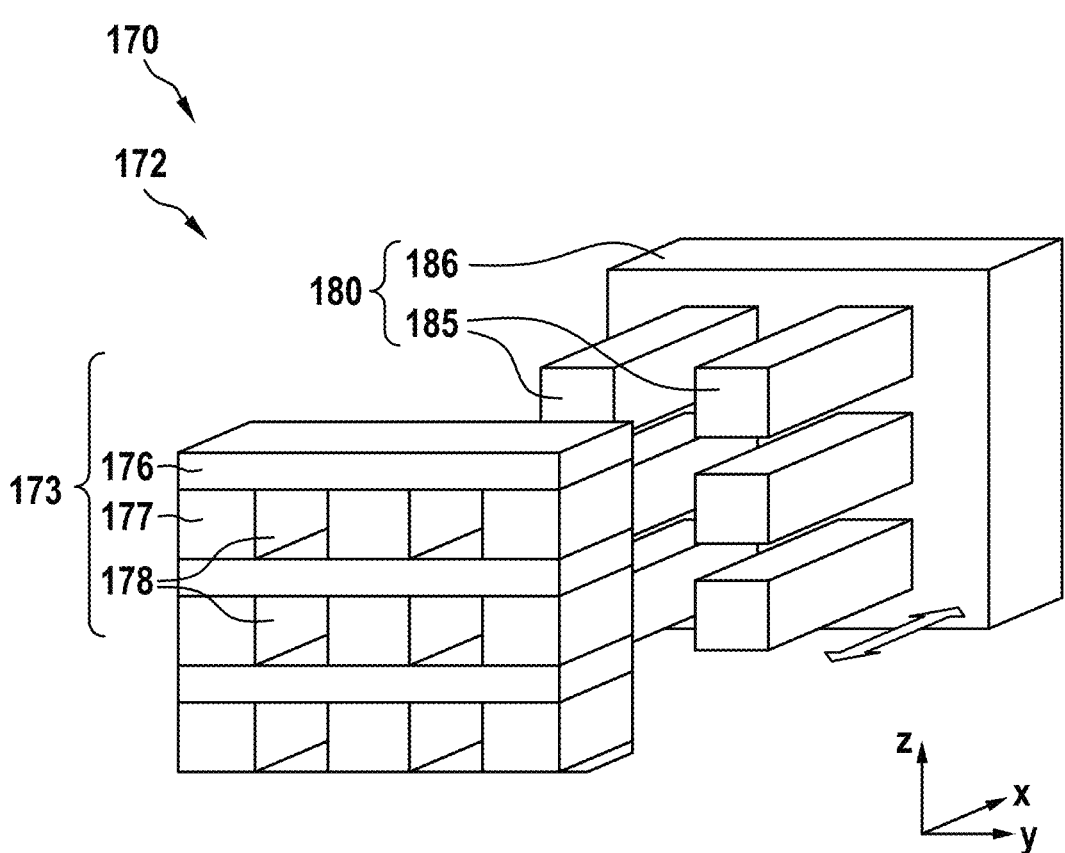
FIG. 15 schematically shows a perspective view of a further drive unit, in which the actuator electrode comprises stamp electrodes extending in the movement direction, while the stator electrode comprises correspondingly shaped hole electrodes for receiving the stamp electrodes, according to an example embodiment of the present invention.

FIG. 15 illustrates a further, particularly advantageous embodiment with respect to increasing the surface of the force field. On the basis of the electrode arrangement of FIG. 13, a further segmentation of the electrode structure is formed perpendicularly to the vertical multiplication direction z. Due to the vertical connections 177 between the electrode plates 176 of a stator electrode 173, stator hole electrodes 178 are created. Complementarily thereto, suitable actuator electrode stamps 185, which can be countersunk electrostatically bidirectionally into the relevant electrode holes 178 of the complementary stator electrode 173, are created from FIG. 13 by segmentation of the electrode plates 184 of the actuator electrode 180 perpendicular to the movement direction x and perpendicular to the multiplication direction z. This results in a 3D comb actuator 172 that can deliver many times the force of a classic in-plane comb actuator. In addition, this structure in principle provides the technological potential to further increase the generated force by reducing the horizontal and vertical electrode gaps (F~1/d) between the stamp electrodes 185 and the hole electrodes 178.

Figure 16:
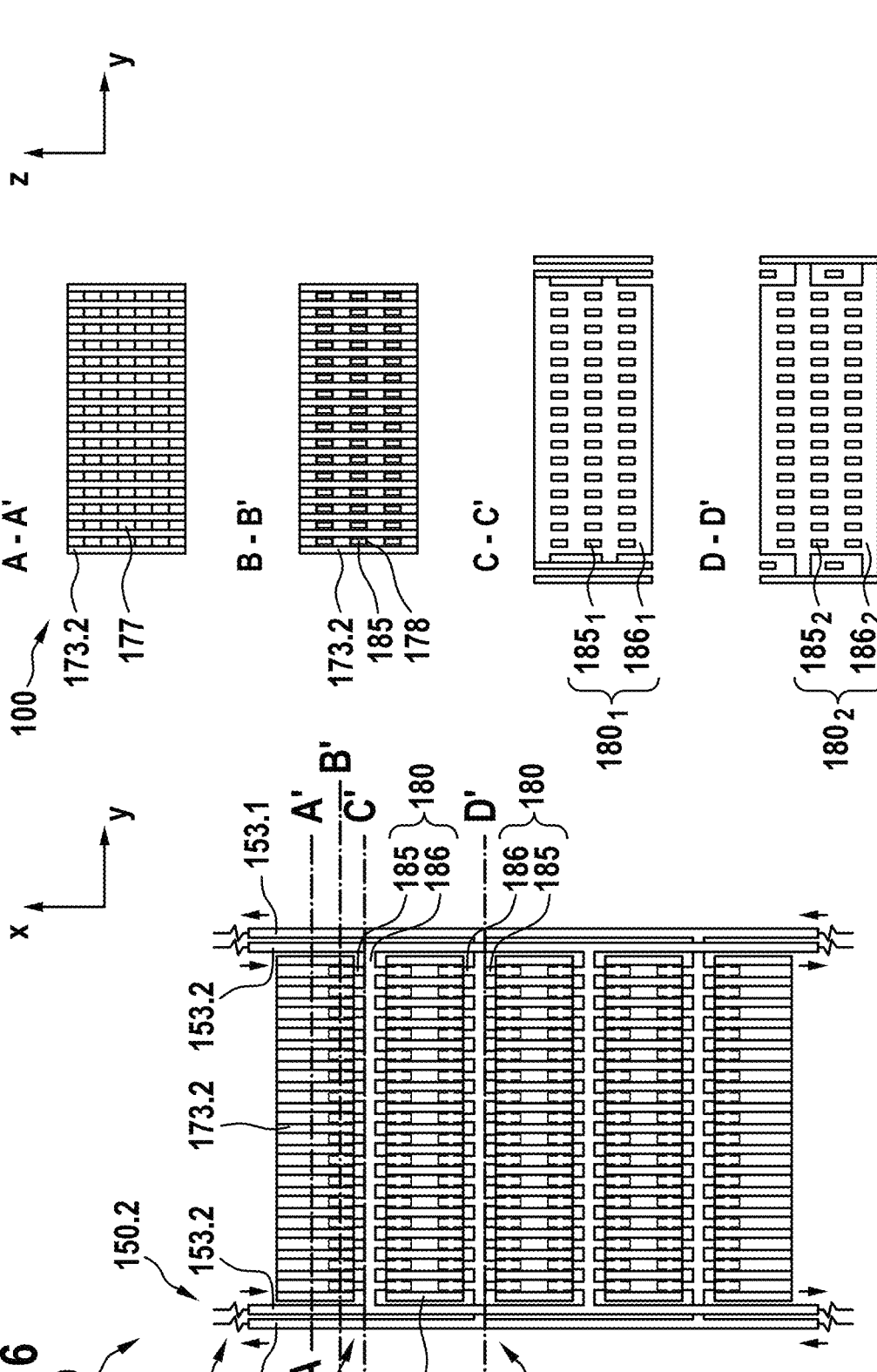
FIG. 16 schematically shows a plan view of an arrangement of two drive supports, driven in opposite directions, with a plurality of drive units of FIG. 15, according to an example embodiment of the present invention.

FIG. 16 shows the design of a drive device 170 with two drive supports 153.1, 153.2 moving in opposite directions to one another, in each case with a plurality of drive units 172 of FIG. 15 in the plan view (left side) and in four cross-sections (right side) perpendicular to the movement direction x. The vertical sequence of the electrode structures makes a 2-periodic interlocking of the drive shuttle structure possible, so that bidirectionality can be implemented within the drive plane by two drive supports (shuttles) 153.1, 153.2 moving in opposite directions. The drive supports 152.1, 152.2 can be suspended via suitable spring structures 190 in the chip frame, wherein the electrical potential can in this case also be applied to the actuator electrodes 180 via the spring structures 190.

Figure 17:
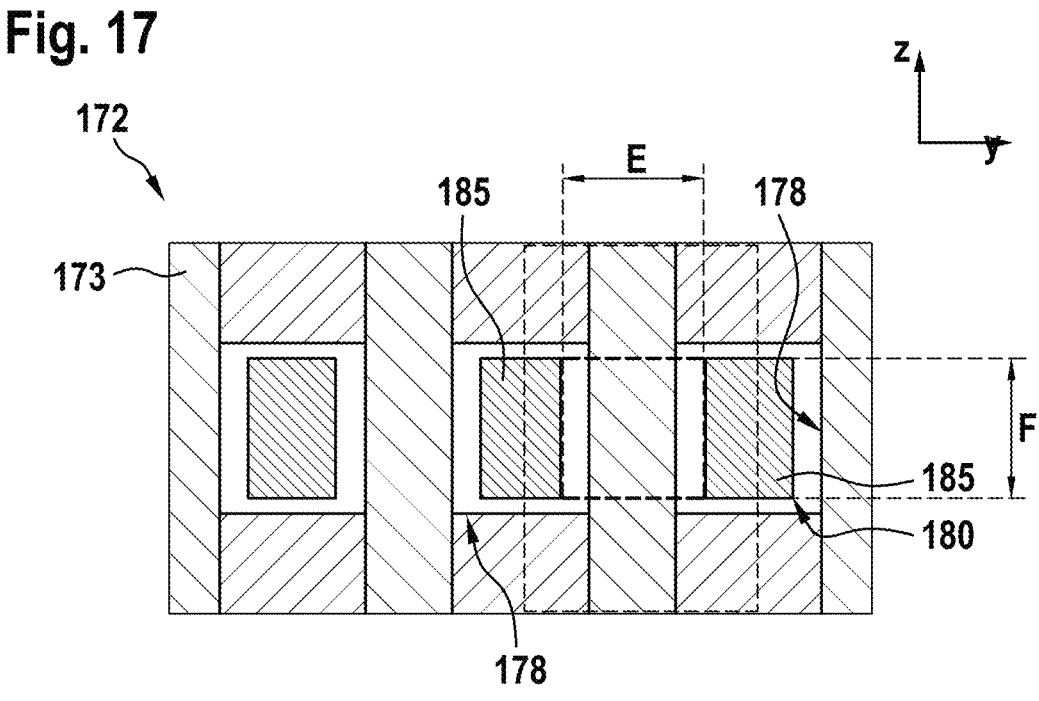
FIG. 17 schematically shows a plurality of stamp electrodes of an actuator electrode, which in each case have a rectangular profile and engage in correspondingly shaped hole electrodes of an associated stator electrode, according to an example embodiment of the present invention.

FIG. 17 illustrates the advantage of the particular design, shown in FIGS. 15 and 16, of the drive electrodes in the form of stamp electrodes and hole electrodes. Shown is a detailed representation of the second cross-section of FIG. 16, in which the stamp electrodes 185 are arranged within the hole electrodes 178. A unit cell (marked with a dashed line) of the electrodes of FIG. 16 is compared to a corresponding electrode region of the embodiment shown in FIG. 14. It can be seen that the loss, associated with the vertical segmentation, of the horizontal electrode surfaces with width E in the 2D comb actuator of FIG. 14 is overcompensated by a gain of vertical electrode surfaces with height F, since the distance F is greater than the distance E. This leads to a further increase in the force surface. It is also apparent that the effective electrode surface of the stamp electrodes 185 and the associated hole electrodes 178 becomes the larger, the higher the relevant electrodes are designed. Depending on the design and technological possibilities, this effect can be further increased if the width of the vertical gaps between the stamp electrodes 185 and the vertical side walls of the hole electrodes 178 and the vertical webs between the hole electrodes 178 are reduced.

Figure 18:
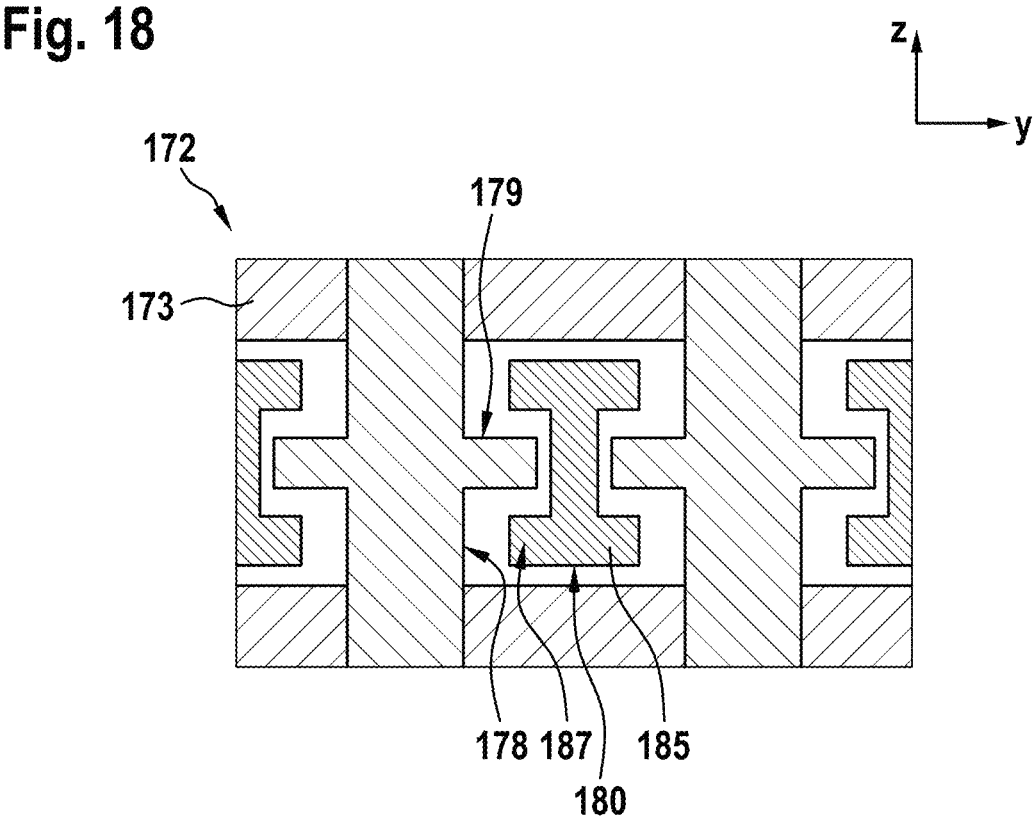
FIG. 18 schematically shows a plurality of stamp electrodes of an actuator electrode, which in each case have a profile in the shape of a double-T-beam and engage in correspondingly shaped hole electrodes of an associated stator electrode.

FIG. 18 illustrates a further possibility for increasing the driving force by way of example. In this case, the effective surface of the force field is increased in that the profile of the stamp electrode 185 is shaped by additional planes in such a way that new surfaces for the effective force field are created. For example, an additional effective electrode surface between the two complementary drive electrodes can be created by a meandering interlocking of the stamp electrodes 184 and the hole electrodes 178. In the present example, the stamp electrode 185 of the actuator electrode 180 has a cross-sectional profile in the shape of a double-T-beam. The associated hole electrode 178 of the stator electrode 173 has a cross-sectional profile correspondingly adapted to the stamp electrode 185. In principle, however, differently shaped cross-sectional profiles of the electrodes are also possible, with which the effective electrode surface and thus also the electric field between the complementary drive electrodes can be increased in a suitable manner.

The concepts illustrated in FIGS. 13 to 18 for increasing the effective electrode surface make it possible to deliver a significantly higher force per chip surface in comparison to a classic in-plane comb drive. Even in an embodiment with only two repetitions of the proposed actuator planes, the segmented electrode structures deliver between 65% and 135% more force per chip surface in comparison to a standard comb drive. The embodiments of FIGS. 13 and 15 make it possible to reduce horizontal or vertical gaps and the structure widths of the actuator layer thickness and web width through technological improvement and thus to generate a further multiplication of the surface of the force field per chip surface. In contrast, the classic in-plane comb drive is not believed to have this technological evolution potential, since an increase in the comb layer thickness (actuator and stator) is generally associated with an increase in the gaps.

Although the present invention has been illustrated and described in detail by the preferred exemplary embodiments, the present invention is not limited to the disclosed examples. Rather, other variations can also be derived therefrom by a person skilled in the art without departing from the scope of the present invention.

The invention claimed is:

1. A microelectromechanical loudspeaker, comprising: a substrate with a substrate surface; a housing arranged on the substrate; a cavity delimited by the housing and the substrate; a translation device, which is arranged in the cavity so as to be movable and deflectable in a specified movement direction parallel to the substrate surface and includes an arrangement of a plurality of movable fin structures, which are arranged next to one another in the movement direction and divide the cavity into a plurality of portions fluidically separated from one another, and a support structure connecting the movable fin structures to one another; a drive device configured to deflect the translation device in the movement direction, the drive device including a plurality of drive units including a plurality of actuator electrodes, wherein each of the plurality of drive units includes at least one actuator electrode of the actuator electrodes, mechanically connected to the translation device, and each of the plurality of drive units includes at least one stator electrode mechanically connected to the housing and/or the substrate, wherein the at least one actuator electrode and the at least one stator electrode assigned to each of the drive units are configured to, when they are subjected to different electrical potentials, generate an electrostatic force that accelerates the translation device in the movement direction; wherein at least some of the actuator electrodes are arranged on the support structure.

2. The microelectromechanical loudspeaker according to claim 1, wherein:

immovable fin structures arranged on the substrate and/or the housing are in each case provided between two directly adjacent, movable fin structures, and a gas volume that can be compressed by a movement of the movable fin structures in the movement direction is formed in each case between the movable fin structures and the immovable fin structures directly adjacent to them.

3. The microelectromechanical loudspeaker according to claim 1, wherein the translation device includes two translation devices moving in opposite directions and including in each case a respective movable support structure and a plurality of respective movable fin structures arranged on the respective support structure are provided in the cavity, wherein the respective movable fin structures of the two translation devices are arranged alternately in the movement direction in such a way that a gas volume that can be compressed by a relative movement of the respective fin structures is in each case formed between the respective movable fin structures of a first translation device of the two translation devices and the respective movable fin structures of a second translation device of the two translation devices.

4. The microelectromechanical loudspeaker according to claim 1, wherein some of the actuator electrodes are arranged on a top side and/or on a bottom side of the at least one movable fin structure.

5. The microelectromechanical loudspeaker according to claim 1, wherein: the housing includes a frame structure laterally enclosing the cavity, wherein the support structure is configured in a shape of a frame, in which the movable fin structures are laterally clamped; at least some of the actuator electrodes are arranged on end faces of the support structure; and stator electrodes assigned to respective actuator electrodes are arranged on inner sides of the frame structure that are arranged opposite the end faces of the support structure.

6. The microelectromechanical loudspeaker according to claim 1, wherein: the housing includes a frame structure laterally enclosing the cavity; the support structure is in a shape of a frame, in which the movable fin structures are laterally clamped; at least some of the actuator electrodes are arranged on an outer side of side walls of the support structure; and stator electrodes assigned to respective actuator electrodes are arranged on inner sides of the frame structure that are arranged opposite the side walls of the support structure.

7. The microelectromechanical loudspeaker according to claim 1, wherein:

the housing includes a frame structure, which laterally encloses the cavity and in which the movable fin structures are laterally clamped; and in a central region of the moveable fin structures, the support structure interconnects the movable fin structures arranged next to one another in the movement direction.

8. The microelectromechanical loudspeaker according to claim 1, wherein on top and/or bottom sides of at least some of the movable fin structures, the at least some of the moveable fin structures include lateral expansion structures, which extend in the movement direction and in each case includes a plurality of the actuator electrodes arranged next to one another in the movement direction.

9. The microelectromechanical loudspeaker according to claim 1, wherein: the actuator electrodes and stator electrodes assigned to the actuator electrodes in each case include a plurality of rail-shaped structures extending in the movement direction; the rail-shaped structures of the actuator electrodes and the rail-shaped structures of the stator electrodes interlock like a comb.

10. The microelectromechanical loudspeaker according to claim 1, wherein the actuator electrodes and the stator electrodes are in each case planar and are arranged opposite one another and separated from one another by a defined gap.

11. The microelectromechanical loudspeaker according to claim 1, wherein the actuator electrodes and the stator electrodes are in each case arranged next to one another in the movement direction and form two interlocking crenellated structures.

12. The microelectromechanical loudspeaker according to claim 1, wherein: the actuator electrodes and stator electrodes assigned to the actuator electrodes are in each case in a form of a plurality of electrode plates, which are arranged one below the other in a direction perpendicular to the substrate surface and extend in parallel with the substrate surface; the electrode plates of the actuator electrodes and the electrode plates of the stator electrodes are arranged alternately in the direction perpendicular to a substrate plane and are in each case connected to one another via their own connection structure.

13. The microelectromechanical loudspeaker according to claim 1, wherein: each actuator electrode of at least some of the actuator electrodes includes a two-dimensional arrangement of stamp electrodes extending in the movement direction and connected to one another via a connection structure, and stator electrodes assigned to the at least some of the actuator electrodes in each case includes an arrangement of correspondingly shaped hole electrodes, wherein each hole electrode is configured to receive the stamp electrodes of the actuator electrode assigned to it.

14. The microelectromechanical loudspeaker according to claim 13, wherein:
the stamp electrodes in each case have a cross-sectional profile with expansions extending perpendicularly to the movement direction; and
the hole electrodes assigned to the stamp electrodes have a cross-sectional profile adapted to the cross-sectional profile of the stamp electrodes.

15. The microelectromechanical loudspeaker according to claim 14, wherein the cross-sectional profile of the stamp electrodes is in a shape of a double-T-beam or cross.

16. The microelectromechanical loudspeaker according to claim 1, wherein the support structure includes a displacement support, which connects the movable fin structures of the translation device to one another, and a drive support, which is mechanically connected to the displacement support and connects the actuator electrodes of the translation device to one another.

* * * * *